United States Patent
Naber et al.

(10) Patent No.: US 9,112,071 B2
(45) Date of Patent: Aug. 18, 2015

(54) METHOD OF MANUFACTURING A SOLAR CELL AND SOLAR CELL THUS OBTAINED

(71) Applicant: Tempress IP B.V., Vaassen (NL)

(72) Inventors: Ronald Cornelis Gerard Naber, Apeldoorn (NL); Johannes Reinder Marc Luchies, Waalre (NL)

(73) Assignee: Tempress IP B.V., Vaassen (NL)

( * ) Notice: Subject to any disclaimer, the term of this patent is extended or adjusted under 35 U.S.C. 154(b) by 0 days.

(21) Appl. No.: 14/400,307

(22) PCT Filed: Jun. 5, 2013

(86) PCT No.: PCT/NL2013/050397
§ 371 (c)(1),
(2) Date: Nov. 10, 2014

(87) PCT Pub. No.: WO2013/183995
PCT Pub. Date: Dec. 12, 2013

(65) Prior Publication Data
US 2015/0114462 A1    Apr. 30, 2015

(30) Foreign Application Priority Data
Jun. 8, 2012   (NL) .................................... 2008970

(51) Int. Cl.
*H01L 31/00*      (2006.01)
*H01L 31/0224*    (2006.01)
*H01L 31/18*      (2006.01)

(52) U.S. Cl.
CPC .. *H01L 31/02245* (2013.01); *H01L 31/022458* (2013.01); *H01L 31/18* (2013.01); *H01L 31/1804* (2013.01); *H01L 31/186* (2013.01);
(Continued)

(58) Field of Classification Search
CPC ................. H01L 31/02245; H01L 31/022458; H01L 31/18; H01L 31/1804; H01L 31/186; H01L 31/1868; Y02E 10/50
USPC .......................................... 136/255, 256, 261
See application file for complete search history.

(56) References Cited

FOREIGN PATENT DOCUMENTS

| EP | 0881694 A1 | 12/1998 |
|----|-----------|---------|
| EP | 2104147 A1 | 9/2009 |

(Continued)

OTHER PUBLICATIONS

Dobrzanski et al. "Final Manufacturing Process of Front Side Metallisation on Silicon Solar Cells Using Conventional and Unconventional Techniques", Journal of Mechanical Engineering 59 (2013), No. 3, pp. 175-182.

(Continued)

*Primary Examiner* — Thanh-Truc Trinh
(74) *Attorney, Agent, or Firm* — Bret E. Field; Bozicevic, Field & Francis LLP

(57) ABSTRACT

The manufacturing of the solar cell comprises the etching of a via hole (2) with a tapered shape such that the diameter (A) at a first side (1a) of the substrate (1), intended as a main side for capturing incident light, is larger than the diameter (B) at the second side (1b) of the substrate (1). The first doped region (3) extends to a first surface (11) in the via hole (2). The second doped region (5) is present at the second side (1b) of the substrate (1) and is suitably formed by ion implantation. The resulting solar cell has an appropriate isolation between first doped region (3) and second doped region (5) over a second surface (12) in the via hole (2) and is suitably provided with a deep junction between the first doped region (3) and dopant in the substrate (1).

18 Claims, 3 Drawing Sheets

Figure 1A:
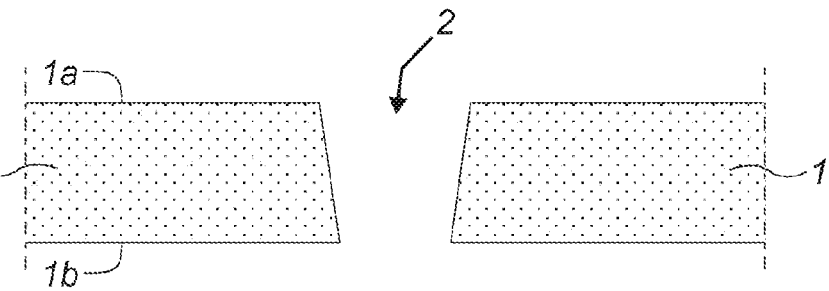

(52) U.S. Cl.
CPC ........... *H01L 31/1868* (2013.01); *Y02E 10/547* (2013.01)

(56) References Cited

FOREIGN PATENT DOCUMENTS

| EP | 2234169 | A1 | 9/2010 |
| JP | 2008-270743 | A | 11/2008 |
| JP | 2008-300440 | A | 12/2008 |
| JP | 2011-91316 | A | 5/2011 |
| WO | 2011/035268 | A2 | 3/2011 |
| WO | 2011/105907 | A1 | 9/2011 |

OTHER PUBLICATIONS

Kreinin et al. "Combined thermal diffusion-ion implantation fabrication processing for silicon solar cells", Opto-Electronics Review, vol. 8, No. 4, Dec. 1, 2000, pp. 317-322.

METHOD OF MANUFACTURING A SOLAR CELL AND SOLAR CELL THUS OBTAINED

FIELD OF THE INVENTION

The invention relates to a method of manufacturing a solar cell comprising the steps of:
  Providing a silicon substrate with a first and a second side, which first side is intended for receiving incident light;
  Providing a first via hole into the substrate, extending from the first to the second side;
  Applying a dopant of a first conductivity type primarily at the first side in a diffusion process to provide a first doped region;
  Applying a dopant of a second conductivity type that is opposed to the first conductivity type to provide a second doped region at the second side of the substrate;
  Providing a passivation layer onto the first and the second side of the substrate and onto at least one surface of the at least one via hole, and
  Applying a conductor material at parts of the first side and the second side of the substrate and into the first via hole to form a via through the substrate.

The invention also relates to a solar cell comprising a n-type silicon substrate with a first and a second side, through which substrate a via comprising conductor material in a first via hole extends from the first to the second side, which substrate comprises a first p-type doped emitter region present at the first side, and a second n-type doped region at the second side serving as a back surface field, the first side being intended as main side for capturing incident light, which solar cell further comprises a passivation layer extends onto the first and the second side of the substrate and onto the at least one surface in the first via hole.

BACKGROUND OF THE INVENTION

As long as solar cells having a semiconductor substrate with vias therein have been under development, one key issue to be addressed is the isolation of the back surface field from the via. Dopants are typically introduced into the semiconductor (i.e. silicon) substrate by means of vapor deposition of a silicate glass layer and a subsequent heat treatment for diffusion of the dopant from the silicate glass into the semiconductor substrate. Hence, they do not merely extend on one side of the substrate, but on any surface. Moreover, the via is used as a conductor to the front side conductive region, typically the emitter, which has to be isolated from the back surface field that defines the opposite electrode. A conductive channel between the via and the back surface field leads to shunting and thus malfunctioning of the solar cell.

Several process requirements make this problem less easy to solve. First of all, the charge carriers may be further diffused through the substrate after their initial definition in heat treatments. Secondly, metal from the via may diffuse through any passivation layer present in the via, with a negative impact. The passivation layer is typically a silicon nitride layer applies with Phase Enhanced Chemical Vapor Deposition (known as PECVD $SiN_x$). Furthermore, photolithographic masking steps commonly applied in the manufacture of integrated circuits are uncommon in solar cell processing, particularly due to cost price limitations.

One solution for obtaining a suitable isolation is known from WO2011/105907. Said document discloses a plurality of process flows, each of which is characterized by the provision of a recess on the second side the substrate, around a via hole. The recess serves to isolate the previously defined back surface field from the emitter on the first side. Both the emitter and the back surface field are herein defined by means of diffusion.

The process flows of WO2011/105907 differ from each other in the order of providing the via hole, the back surface field, the emitter on the front side and the recesses. It is not at all specified in this patent application which one of the flows is considered most advantageous. A skilled person would therefore look to an order that is most common so as to minimize process steps, or to obtain a most logical order. Such most logical and hence preferred order appears to be carrying out first the diffusion steps, and thereafter carrying out the laser treatments of creating recesses and drilling via holes.

One disadvantage of this process order is that the via hole formation occurs as the last step. In practice, the via hole formation is followed by a damage removal step for removal of any damage resulting from the laser drilling of the via hole. This damage removal step typically comprises an etching treatment and is most suitably combined with the provision of texture on the first side of the substrate, so as to maximize light capturing. This alternative order is also indicated in WO2011/105907. Herein via holes are provided prior to creating the texture on the first side. Subsequently, the back surface field and the emitter are provided by diffusion and the recesses are provided in another laser etching treatment. One issue herein appears however that dopant species of both the back surface field and the emitter may end up inside the via hole leading to low shunt resistance of leakage.

SUMMARY OF THE INVENTION

Accordingly, it is a first object of the present invention to provide an improved method of manufacturing of a solar cell comprising an emitter on the first side, a back surface field on the second side and a via extending from the first side to the second side. Particularly, the manufacturing method should be efficient from a processing perspective, reducing yield loss and lower cost.

It is a further object to provide a resulting solar cell that is provided with an appropriate isolation of the via from the back surface field.

In a first aspect, the invention provides a method of manufacturing a solar cell comprising the steps of: providing a silicon substrate with a first and a second side, which first side is intended for receiving incident light; providing a first via hole into the substrate, which first via hole extends from the first side towards or to the second side; applying a dopant of a first conductivity type primarily at the first side in a diffusion process to provide a first doped region; applying a dopant of a second conductivity type opposed to the first conductivity type to provide a second doped region at the second side of the substrate; providing a passivation layer onto the first and the second side of the substrate and onto the at least one surface in the first via hole; applying conductor material into the first via hole to form a via through the substrate. Herein, the first doped region is defined on the first side and at a first surface in the first via hole, said first surface extends to the first side and is spaced apart from the second side of the substrate through a second surface. Moreover, the first via hole is provided with a tapered shape, resulting in such that the first via hole has a first diameter at the first side and a second diameter at the second side, wherein the first diameter is larger than the second diameter.

In a second aspect, the invention provides a solar cell comprising a semiconductor substrate with a first and a second side, through which semiconductor substrate at least one via comprising conductor material in a first via hole extends from the first to the second side, which substrate comprises a first doped emitter region comprising dopants of a first conductivity type at the first side, and a second doped region comprising dopants of a second conductivity type opposed to the first conductivity type at the second side serving as a back surface field, the first side being intended for capturing incident light, which solar cell further comprises a passivation layer extends onto the first and the second side of the substrate and onto the at least one surface in the first via hole. The emitter region extends to a first surface defined in the first via hole, which first surface is spaced apart from the back surface field at the second side of the substrate through a second surface.

According to the invention, use can be made of a more conventional process flow, in which the first via hole is processed into the substrate prior to texturing the first side of the substrate, which saves one process step. This process flow moreover allows extension of the emitter to a first surface in the first via hole. Such extended emitter is considered to improve efficiency of the solar cell, since the p-n-junction will have a larger surface area. Therewith, the chance of catching minority carriers prior to recombination is increased, resulting in higher efficiency. The controlled extension of the emitter (i.e. the first doped region) to the first surface in the via hole is achieved by definition of this first surface within the first via hole having a tapered shape. This definition may for instance be achieved afterwards by controlled removal of part of the first doped region out of the via hole. The definition may further be effected prior to the diffusion step. The tapered shape is effective for the processing, as the via hole has smaller diameter at the second side than the first side. The surface area (per unit of depth) of the second surface is therefore smaller than that of the first surface. The second surface effectively functions as an emitter-BSF isolation area, that is traditionally defined on the second side of the substrate.

In a preferred embodiment, use is made of ion implantation for definition of the second region on the second side. Contrarily to diffusion, ion implantation results in the provision of dopants on a single side of the substrate only; its ion beam has a directional nature that will not affect the first side if directed to the second side. Therewith, the issue of mutually isolating the first and doped regions is achieved without a need for removal steps afterwards.

If there would nonetheless get some implantation into the vias or at the substrate edges—either directly or via backscattering, such parasitically implanted ions may be easily removed afterwards in an etch treatment. Since the dosage of the parasitically implanted ions is very low, certainly in comparison to the implanted dose at the second side, it does not effectively amorphize the surface and therefore a simple alkaline etch may remove the parasitically implanted ions without destroying the second region. In fact, the implantation dose towards the second side is preferably chosen so as to amorphize the substrate surface.

In other words, a simple etch may be selective without a need for an etching mask. It is however not excluded that a layer would be selectively deposited on the second side, after which the areas in the via hole and at the substrate edges are cleaned from implantation and layer, if any.

Preferably, the first surface in the first via hole includes an angle with a normal to the first side of the substrate of at least 3 degrees, preferably larger than 4 degrees. The term 'normal to the first side' is herein intended to refer to the normal without taking into account the texture on the first side. This tapering angle allows overcoming a tolerance in conventional ion implanters. This tolerance is a directional uniformity within 3 degrees.

The second surface is suitably smaller than the first surface. Preferably, the second surface has a shorter length than the first surface. Herein, the length is defined in the same direction as the substrate thickness, i.e. normal to the first and the second side of the substrate. Suitably, the second surface has a length of at most 30% of the substrate thickness, for instance in the range of 25-100 microns, suitably 40-70 microns. The minimum is herein defined on the basis of a minimum electrical isolation. The more thorough any removal of dopant is, the smaller the minimum thickness will be. The maximum is herein derived from the processing: due to the tapered shape, removal of dopant within a via hole gets more difficult and will be slower when going upwards, i.e. with increasing via diameter.

The inventors of the present invention have realized, in the course of investigations leading to the invention, that an insulation area within the via hole, located at the second surface, can be manufactured adequately and is thus robust. Moreover, it has a very small surface area compared to traditional isolation areas between doped regions, particularly those of opposed polarity. An isolation area at the second surface is typically defined by means of screen printing. This is a low-resolution process, which is relatively rough. As a consequence, an isolation area will be chosen sufficiently wide so as to avoid any failure of the solar cell. In comparison therewith, the second surface can be free of any additional isolation area between the via and any further doped region, such as a back surface field or another region, for instance a doped region corresponding to a back contact of an interdigitated back contact design.

In a further embodiment, the second side is thus provided with a back surface field (BSF) extending towards the via or up to the via without any intermediate emitter-BSF isolation area defined, at least largely or substantially, at the second side. The BSF may herein be a full BSF, a selective BSF or a patterned BSF. A full BSF and a selective BSF are continuous around the via, wherein the selective BSF is provided with a first and a second zone of mutually different doping level according to a predefined pattern. The patterned BSF includes predefined areas without BSF and may further comprise zones of mutually different doping level. This absence of an emitter-BSF isolation area at the second side of the substrate increases efficiency.

Moreover, said absence furthermore allows an increase in the density of via holes, therewith reducing losses in efficiency. Thus increase in density is not merely an incremental improvement, but has in itself positive impact on the assembly: pad size and solder ball size may be reduced.

Another advantage of the process of the invention resides therein that the silicate glass layer formed in the diffusion step can be used as a temporary protection layer for the emitter diffusion during the ion implantation step. Furthermore, it may be used as a carrier for the processing of the second side. This glass layer provides additional strength to the substrate that is typically very thin and moreover fragile as a consequence of the presence of texture on the first side and the presence of via holes. Moreover, the silicate glass layer smoothens the texturized surface, which results in a better support. If desired, any attachment features may be specified into this silicate glass layer so as to optimize its function as a carrier. Such attachment features may for instance be obtained by definition of grooves, cavities or dedicated support surfaces, for instance with a laser. An alternative attachment feature is for instance a planarisation step, either by etching or by application of a sacrificial layer, which is most suitably removable together with the silicate glass layer, such as a silicon oxide layer.

The passivation layer in the process of the invention is suitably formed by thermal oxidation during co-diffusion of the first and the second dopants. This combined thermal oxidation and co-diffusion step further brings the p-n junction deeper into the substrate without reduction of the sheet resistance of the emitter, therewith reducing recombination losses and increasing cell efficiency. Deep junction depths can be in the range of 0.4-1 micrometer. Moreover, the thermal oxidation reduces or even minimizes out-diffusion from the doped regions during co-diffusion, which could otherwise lead to local overcompensation of the emitter (i.e. the first doped region), and as a consequence, lead to shunting problems.

The combination of an emitter with a deep junction depth that extends into the preferably tapered via and proper isolation to the back surface field—as made in ion implantation—is deemed to provide lower recombination losses and therewith higher efficiency.

Most suitably, the provision of the passivation layer further comprises applying a nitride layer onto the first and the second side and onto said wall in said via hole by means of LPCVD. The LPCVD, i.e. low pressure chemical vapour deposition, technique results in a high density nitride layer that prevents any physical contact between any metal within the via and the second doped region, i.e. the back surface field. This further reduces the risk of shunting between via and back surface field. Relevant in relation hereto is that the LPCVD nitride is enabled by the use of thermal oxidation as primary passivation, as LPCVD silicon nitride does not passivate well on a silicon substrate surface.

In a preferred embodiment, the definition of the first doped region comprises the step of etching from the second side. Most suitably, this is combined with a so-called back-to-back positioning of the substrates during diffusion, such that less dopant is deposited on the second side than on the first side. A gentle etching step may then remove the dopant from the second side and from the second surface in the via hole. It is observed herein, that the tapered shape of the via hole is herein beneficial: the tapered shape effectively implies that the volume of silicate glass per unit of depth in the via hole decreases from the first side towards the second side. Hence, when etching from the second side, the etching speed (in unit depth per unit time) into the via hole decreases with time. Therefore, the duration of the etching treatment can be suitably used for removal of the dopant from the second surface and therewith controlling the definition of the first doped region. The etching process may be further controlled with the viscosity of the etchant, which is dependent on the temperature and the chemical composition of the mixture. Systems for one-sided etching and particularly removal of a silicate glass and dopant from one side of the semiconductor substrate are commercially available from Rena GmbH under the name InOxSide™. Details of such a system are for instance specified in DE102009059704A1 and WO2005/093788, which are included herein by reference. Herein, an etching treatment is carried out by dipping one side of the substrate into a bath of etching liquid. More specifically, the substrate is carried by means of transport rolls, of which a top side defines an upper surface of the etching batch, i.e. the meniscus thereof.

In a second embodiment, the first via hole is initially defined to extend into the substrate from the first side towards, but without extension to the second side. This initial via hole is provided with the first surface. The via hole is opened only after application of the first p-type dopant. In this embodiment, the distinction between the first surface and the second surface is created inherently, in that the second surface is only generated after the provision of the first dopant.

For the opening of the via hole, several options are available, both from the first side and the second side. Opening from the first side is suitably enabled by layer removal within the via hole. This may be carried out in a laser treatment, with anisotropical etching, for instance with dry etching or reactive ion etching, with wet-chemical etching of the silicon substrate or in a combination thereof. The silicate glass layer could be used here as an etching mask preventing etching of the silicon substrate outside the via hole. Opening from the second side may be carried out with any known technique, such as a laser treatment, anisotropical or wet-chemical etching. Suitably, an etching treatment is carried out prior to removal of the silicate glass. In this manner, the silicate glass can be effectively used as an etch-stop layer. Preferably, the opening from the second side of the substrate is carried out after provision of the second doped region by means of ion implantation.

For sake of clarity, it is added that usually a plurality of via holes and corresponding vias will be processed into the substrate. Most suitably, all said via holes are of the same design and serve the same purpose, which typically is the connection of the emitter on the first side to contacts on the second side. However, it is not necessary that all via holes are of the same design as the first via hole and serve the same purpose.

In a most suitable embodiment thereof, the ion implantation is carried out so as to result in amorphization of the silicon substrate. The amorphized substrate may thereafter be locally recrystallized, for instance with a laser. The recrystallized portion can then be removed selectively by etching. The selectively exposed non-doped silicon may thereafter be removed in a continued etching treatment that is selective relative to the amorphized and doped second region. Such local recrystallisation may also be used for creating a selective back surface field, as described in the non-prepublished Dutch patent application of Applicant with nr NL 2008755 (PCT/NL2013/050338), which is herein included by reference.

According to one further aspect, the invention provides a method of manufacturing a solar cell comprising the steps of: providing a silicon substrate with a first and a second side, which first side is intended for receiving incident light; providing a first via hole into the substrate, which first via hole extends from the first side towards or to the second side; applying a dopant of a first conductivity type primarily at the first side in a diffusion process to provide a first doped region; applying a dopant of a second conductivity type opposed to the first conductivity type to provide a second doped region at the second side of the substrate; providing a passivation layer onto the first and the second side of the substrate and onto the at least one surface in the first via hole; applying conductor material into the first via hole to form a via through the substrate. Herein, the first doped region at the first side is formed before formation of the second type doped region by ion implantation, wherein a silicate glass resulting from said diffusion step at the first side is used as a carrier for the substrate during the application of said second doped region.

According to again a further aspect, the invention provides a method of manufacturing a solar cell comprising the steps of: providing a silicon substrate with a first and a second side, which first side is intended for receiving incident light; providing a first via hole into the substrate, which first via hole extends from the first side towards or to the second side; applying a dopant of a first conductivity type primarily at the first side in a diffusion process to provide a first doped region;

applying a dopant of a second conductivity type opposed to the first conductivity type to provide a second doped region at the second side of the substrate; providing a passivation layer onto the first and the second side of the substrate and onto the at least one surface in the first via hole; applying conductor material into the first via hole to form a via through the substrate. Herein, the first doped region is defined on the first side and at a first surface in the via hole, said first surface extends to the first side and is spaced apart from the second side of the substrate through a second surface, and that the second doped region is formed by ion implantation.

It will be understood that the advantages of the invention, as discussed with respect to one or more embodiments corresponding to the features of these aspects, apply correspondingly to this aspect. Furthermore, the invention, as recited in accordance with these aspects may be combined with any one of the more specific embodiments and implementations as discussed hereinabove and hereinafter with reference to the figures.

BRIEF INTRODUCTION OF THE FIGURES

Figure 1B:
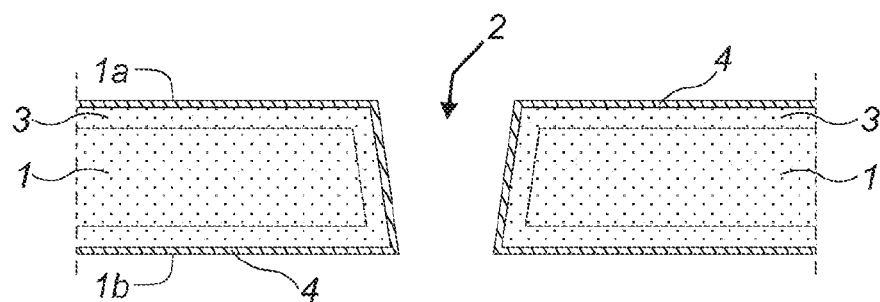
Figure 1C:
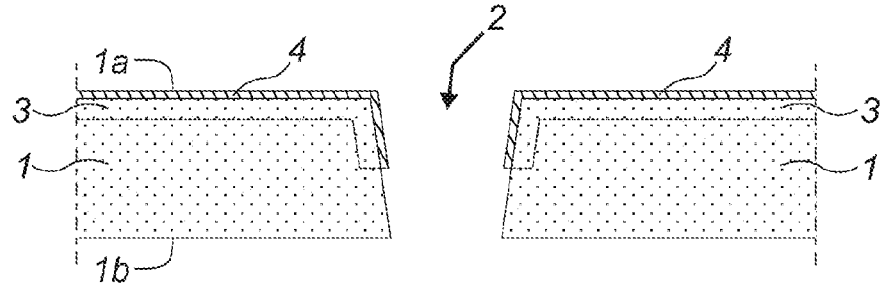
Figure 1D:
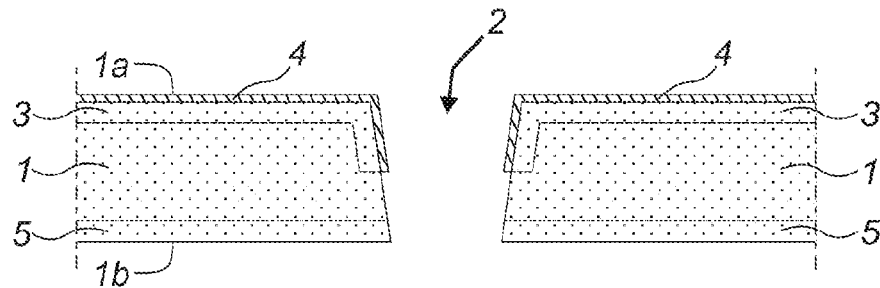
Figure 1E:
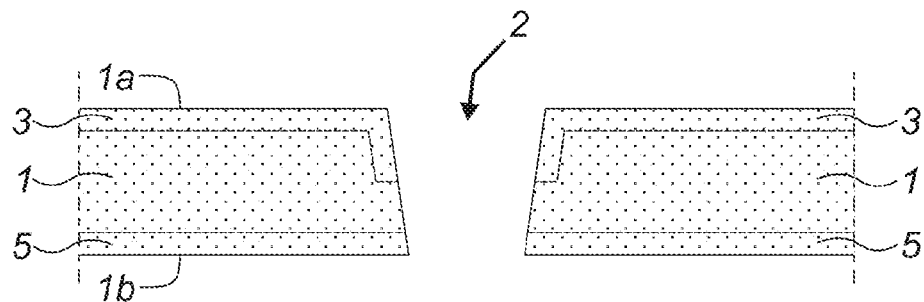
Figure 1F:
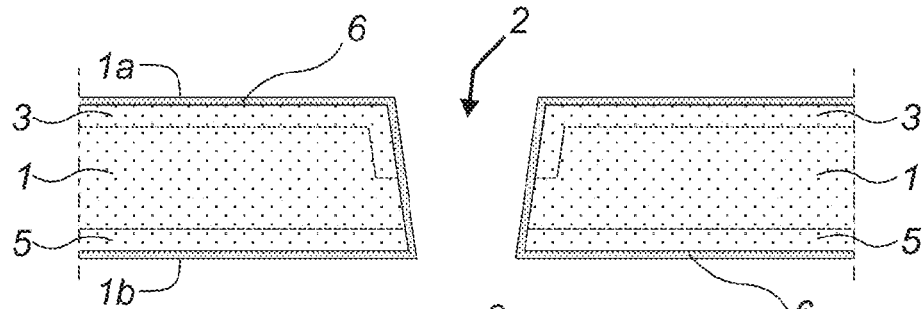
Figure 1G:
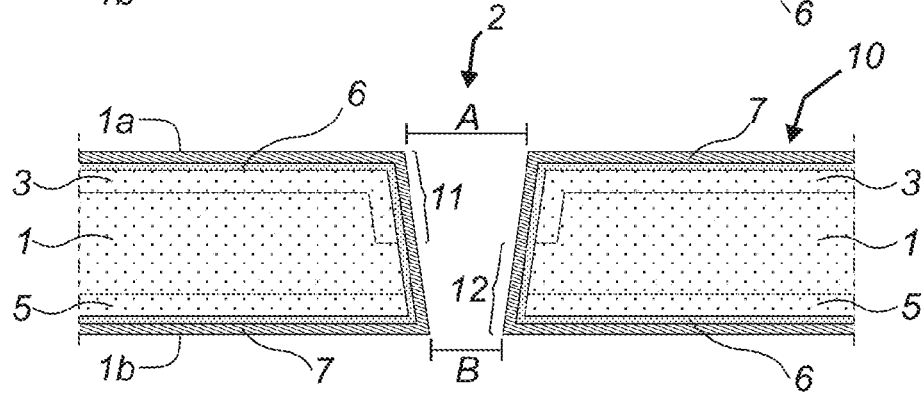
Figure 2:
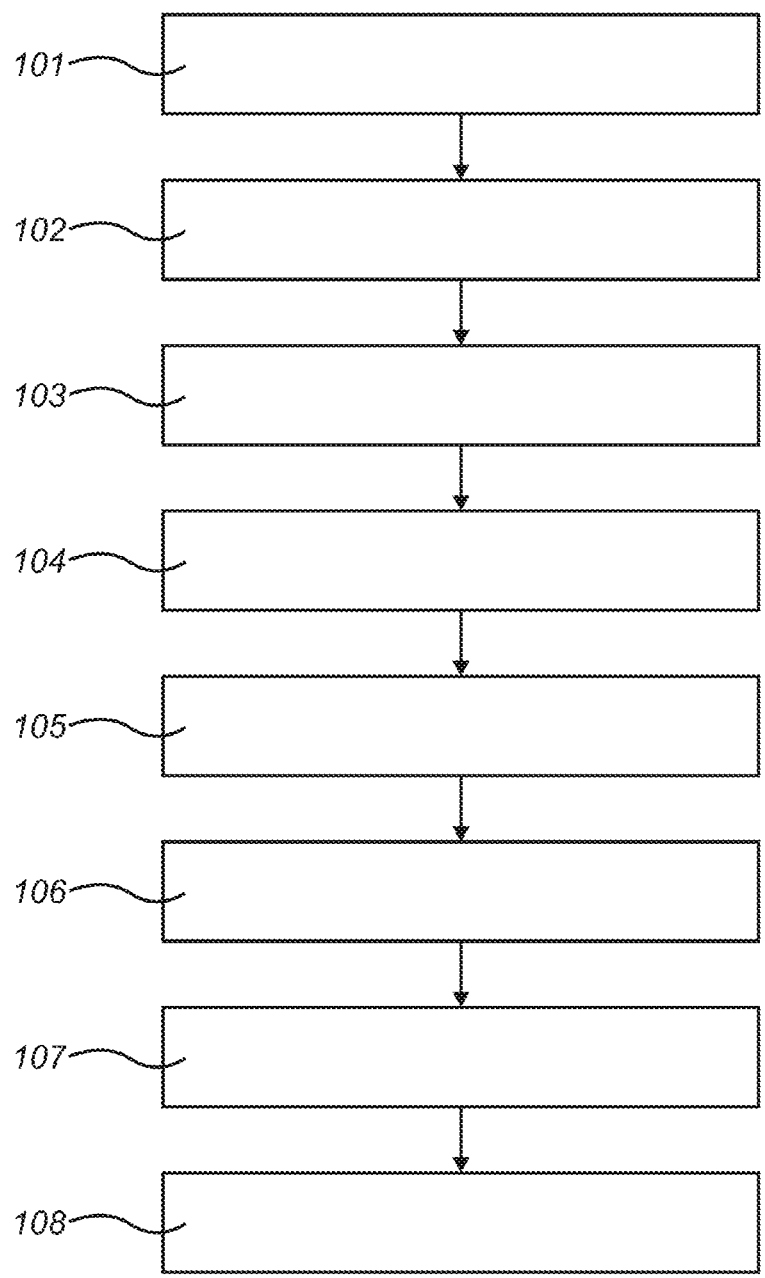

These and other aspects of the invention will be further elucidated with reference to the Figures, that are diagrammatical in nature and not drawn to scale and wherein:

FIG. 1a-1g shows in diagrammatical cross-sectional view a sequence of steps in accordance with one embodiment of the method of the invention, of which FIG. 1g shows the resulting product, and FIG. 2 shows a flow diagram largely corresponding to FIG. 1a-1g.

DETAILED DESCRIPTION OF EXEMPLARY EMBODIMENTS

The figures disclose a single embodiment for illustrative purposes. Equal reference numerals in different figures refer to equal or corresponding elements.

FIG. 1g shows a solar cell in accordance with the invention, and made in accordance with the process of the invention. In fact, FIG. 1g shows in diagrammatical cross-sectional view a solar cell semi-manufactured article rather than a complete solar cell.

Conductors and contacts are not shown, as these are not relevant to the present invention. Moreover, the skilled person will be aware how to convert the shown semi-manufactured article in a complete solar cell. For sake of simplicity, the product shown in FIG. 1g is also referred to as a solar cell 10. The solar cell 10 comprises a semiconductor substrate 1 with a first side 1a and a second side 1b. In this embodiment, the first side 1a constitutes the so-called front side provided with a texture, which first side is intended as a main side for capturing incident light. The second side 1b is constitutes the so-called rear side primarily intended for assembly to a carrier. However, it is not excluded that light may be captured through the second side, particularly if the solar cell (as assembled to the carrier) is positioned in an oblique orientation to an underlying surface, and said second side is not transparent for light. The present solar cell comprises a first via hole 2 extending through the substrate 1 from the first side 1a to the second side 1b. While for sake of clarity, merely one via hole 2 is shown, it will be understood by the skilled person that typically a plurality of via holes is present. More precisely, it is a more specific object of the invention to provide a metal-wrap-through (MWT) type solar cell as known per se to the skilled person.

This solar cell 10 comprises an emitter 3 extending on the first side 1a of the substrate and on a first surface 11 in a via hole 2. The emitter 3 is separated from a back surface field 5 extending on the second side 1b through a second surface 12 in the via hole 2. The shown cell 10 comprises a passivation with a thermal oxidation layer 6 and a supplementary layer 7. The supplementary layer 7 is in this example a LPCVD silicon nitride layer, which acts as a barrier against diffusion of metal elements or ions from the conductor to be applied in the via hole 2 into the substrate 1. Such diffused metal elements could lead to shunting between the back surface field 5 and said conductor, and hence malfunctioning of the solar cell 10.

The via hole 2 has a tapered shape, with a first diameter A at the first side 1a and a second diameter B at the second side 1b. The second diameter B is smaller than the first diameter A. The tapered shape is highly beneficial for the preferred manufacturing process according to the invention, in which the emitter is formed by diffusion and the back surface field by ion implantation, as will be explained hereinafter with respect to FIG. 1a-1g and the flow diagram in FIG. 2.

It is observed that a via hole with a tapered shape is known per se, for instance from JP-2008-270243A1. The known tapered via hole is provided with dopant along its complete surface. This dopant is preferably phosphor (N-type, corresponding to a p-type substrate. The doped region preferably continues at the second side of the substrate, where it defines an interface layer for a metal electrode deposited subsequently. The dopant is preferably applied with the diffusion method after vapour deposition. However, no passivation layer is applied. Instead, the said doped region is connected to the metal electrode on the second side and to the metal body of the via. The electrode on the second side herein covers the via hole, so as to act as a barrier against the penetration of moisture.

FIG. 1a-g shows a sequence of process steps for manufacturing a solar cell semi-manufactured article. FIG. 2 shows a flow diagram for forming the solar cell 10 largely corresponding to the steps of FIG. 1a-1g.

In a first step 101, as shown in FIG. 1a, a via hole 2 is applied extending from the first side 1a to the second side 1b of the substrate 1. The via hole is applied by laser drilling using a laser device ejecting a laser beam. Most suitably, this laser beam is oriented substantially normal to the first side 1a of the substrate 1. With such orientation, the shape of the via hole can be controlled to provide tapering with a predefined angle. In a preferred implementation, the laser beam makes a slightly rotating movement within the perimeter of the intended via hole.

Texturing is applied thereafter in a second step 102, in known manner to the first side 1a of the substrate 1. It appears most suitable that the texturing is applied on the first side only, but the provision thereof on both the first side 1a and the second side 1b is not excluded. During texturing any damage resulting from the via hole formation is removed as well.

In a third step 103, shown in FIG. 1b, dopant is provided in a diffusion step. The first dopant is preferably boron. The diffusion step comprises a gas phase deposition, for instance of BBr3, resulting in the formation of a (boron) silicate glass 4, and a thermal treatment, resulting in diffusion of the dopant from the silicate glass 4 into the semiconductor substrate to form a first doped region 3. While FIG. 1b suggests the application of a silicate glass 4 and first doped region 3 of uniform thickness on all sides 1a, 1b of the substrate 1 and within the via hole 2, this is typically not true. Suitably, substrates 1 are positioned back-to-back, so as to minimize diffusion of dopant to the second side 1b of the substrate 1. As a result, the silicate glass 4 and the doped region 3 will be thinner at the second side 1b than at the first side 1a.

In a fourth step 104, a cleaning and removal step is carried out on the second side 1b and (partly) into the via hole 2. The result is shown in FIG. 1c. This cleaning and removal step 104 is more precisely an etching step, so as to remove any dopant resulting from the diffusion step 103 on the second side 1b, and partially within the via hole 2. Any silicate glass that may be formed at the second side 1b as a consequence of the diffusion step 103 is herein removed as well. Therewith the first doped region 3 is actually defined, so that it extends on the first side 1a, and at a first surface 11 in the via hole 2. This first surface 11 is spaced apart from the second side 1b through the second surface 12. Suitably, the first surface has a larger extension (in the main direction of the via hole 2) than the second surface, but this is not necessary.

The etching step 104 is merely applied to the second side 1b and not to the first side 1a, in a way that ensures that the silicate glass 4 on the first side 1a, particularly the boron silicate glass, is not removed. The presence of the (boron) silicate glass 4 at the first side 1a furthermore allows laying down the substrate 1 with its first side 1a on a wafer table, i.e. a chuck. The boron silicate glass will be removed afterwards, such that any contamination, cracks and damage to the silicate glass do not negatively affect the performance of the resulting solar cell.

In a fifth step 105, of which the result is shown in FIG. 1d, a ion implantation step is carried out at the second side 1b. This ion implantation step is in this example a blanket ion implantation, although a selective ion implantation is not excluded. Preferably, the implantation is carried out so as to form an amorphized doped region 5. Suitably, phosphorous is implanted as a second dopant into the semiconductor substrate in this step.

In a sixth step 106, of which the result is shown in FIG. 1e, the (boron) silicate glass is removed from the first side 1a, and from the first surface 11 in the via hole 2. This removal of the silicate glass occurs in known manner.

In a seventh step 107, of which the result is shown in FIG. 1f, a thermal oxidation is carried out, resulting in a thermal oxide layer 6, constituting part of the passivation layer. The thermal diffusion is carried out such as to simultaneously achieve co-diffusion of the first dopant and the second dopant further into the substrate 1. The design of this step involves the specification of temperature, oxygen pressure and duration, as is known per se to the skilled person.

In an eighth step 108, of which the result is shown in FIG. 1g, a silicon nitride layer 7 is grown onto the passivation layer 6, preferably in a low pressure chemical vapor deposition (LPCVD) process. While a LPCVD silicon nitride layer is considered most advantageous for isolation of any via metal (to be applied) and the back surface field, any other deposition method could be used instead. Moreover, the material could be different from silicon nitride. It is even not excluded that this step is overall left out.

The solar cell semi-manufactured article 10 is now ready. It will be understood by the skilled person that manufacturing proceeds with the definition of contacts and conductors through the via holes 2, which may be carried out in known manner. The result will be a solar cell with contacts both to the emitter 3 and to the back surface field 5 on the second side 1b of the substrate. Conductors running through the via holes 2 will connect the emitter 3 to the respective contacts on the second side 1b. Suitably, use is made of an emitter, wherein the conductor contacts the doped region merely locally, rather than across the full surface. This has the advantage that the substrate (and thus also the junction) remains protected against moisture by means of the passivation layer.

For sake of clarity it is added that the first and second conductivity types of the dopants as used in the context of the present application are particularly p-type respectively n-type dopants as known per se. However, the opposite is not excluded. Furthermore, as known to the skilled person, the semiconductor substrate is more particularly a silicon substrate. Such a semiconductor substrate is typically lightly doped as known per se to the skilled person. The expression 'lightly doped' is conventionally used relative to the dopant levels in the first and second doped regions, that are 'heavily doped'. Dopant levels are well-known to the skilled person in the art. In the context of the present invention, the semiconductor substrate is most suitably a n-type silicon substrate, even though another type of substrate is not excluded. Most preferred is the use of a mono-crystalline semiconductor (silicon) substrate.

In summary, the manufacturing of the solar cell according to the invention comprises the etching of a via hole 2 with a tapered shape such that the diameter A at a first side 1a of the substrate 1, intended as a main side for capturing incident light, is larger than the diameter B at the second side 1b of the substrate 1. The first doped region 3 extends to a first surface 11 in the via hole 2. The second doped region 5 is present at the second side 1b of the substrate 1 and is suitably formed by ion implantation. The resulting solar cell has an appropriate isolation between first doped region 3 and second doped region 5 over a second surface 12 in the via hole 2 and is suitably provided with a deep junction between the first doped region 3 and dopant in the substrate 1.

The invention claimed is:

1. A method of manufacturing a solar cell comprising the steps of:

Providing a silicon substrate with a first and a second side, which first side is intended as main side for capturing incident light;

Providing a first via hole into the substrate, which via hole extends from the first to the second side or towards the second side without extension thereto, which first via hole is provided with a tapered shape, such that the first via hole has a first diameter at the first side and a second diameter at or near the second side respectively, wherein the first diameter is larger than the second diameter, Applying a dopant of a first conductivity type in a diffusion process to provide a first doped region, the first doped region is defined on the first side and at a first surface in the first via hole;

Applying a dopant of a second conductivity type opposed to the first conductivity type to provide a second doped region at the second side of the substrate;

Providing a passivation layer onto at least one side of the substrate;

Applying conductor material at parts of the first side and the second side of the substrate and into the first via hole to form a via through the substrate to define a first conductor, wherein:

the second doped region is a back surface field (BSF) that extends up to the via without any substantial intermediate emitter-BSF isolation area at the second side of the substrate;

the first surface extends to the first side and is spaced apart from the second side of the substrate through a second surface in the first via hole, which second surface defines an isolation area between the first doped region and the second doped region;

the passivation layer is provided onto the first and the second side of substrate and onto at least one surface of the first via hole, the first conductor provides a connection from the first doped region acting as an emitter on the first side to contacts on the second side.

2. The method as claimed in claim 1, wherein the second doped region is formed by ion implantation.

3. The method as claimed in claim 1, wherein the definition of the first doped region comprises an etching step of the second side to remove dopant of the first conductivity type present in the substrate at the second side, and at the second surface of the via hole.

4. The method as claimed in claim 3, wherein the etching step is carried out as a single-side etch process wherein portions of the second side of the substrate and said at least one via hole are consecutively brought into contact with an etching liquid.

5. The method as claimed in claim 1, wherein the first via hole is initially defined from the first side towards the second side but without extension to the second side, and wherein the first via hole is opened after application of the first dopant.

6. The method as claimed in claim 5, wherein the opening of the via hole from the second side of the substrate is carried out after provision of the second doped region by means of ion implantation.

7. The method as claimed in claim 1, wherein a thermal treatment is carried out for co-diffusion of the dopants of the first and the second conductivity type, said thermal treatment resulting in formation of an oxide serving as a passivation layer for all sides of the substrate.

8. The method as claimed in claim 7, wherein the provision of the passivation layer further comprises applying a nitride layer onto the first and the second side and onto said first and second surfaces in said via hole by means of LPCVD.

9. The method as claimed in claim 1, wherein a silicate glass resulting from said diffusion step at the first side is used as a protection layer of the first doped region during the application of said second doped region.

10. The method as claimed in claim 9, wherein the first via hole is manufactured by a laser beam that is directed substantially normal to the first side of the substrate and impinges onto the substrate directly without reflection in a mirror.

11. The method as claimed in claim 10, wherein the laser beam carries out a rotating movement within a perimeter of the intended via hole, said rotating movement being relative to the substrate.

12. The method as claimed in claim 1, wherein the second surface has a dimension of at most 30% of the substrate thickness.

13. The method as claimed in claim 12, wherein the second surface has a dimension of 25-100 microns.

14. The method as claimed in claim 1, wherein the first conductor contacts the emitter locally.

15. A solar cell comprising a semiconductor silicon substrate with a first and a second side, the first side being intended as main side for capturing incident light, through which substrate a first via comprising conductor material in a first via hole extends from the first to the second side, which first via hole is substantially tapered, having a first diameter at the first side and a minimum diameter at or near the second side, the minimum diameter being smaller than the first diameter, which substrate comprises a first doped emitter region comprising dopant of a first conductivity type present at the first side and extending to a first surface defined in the first via hole, and a second doped region comprising dopant of a second conductivity type opposed to the first conductivity type, at the second side serving as a back surface field, which solar cell further comprises a passivation layer extending onto the at least one side of the substrate, wherein:

the second region is a back surface field (BSF) that extends up to the via without any substantial intermediate emitter-BSF isolation area at the second side of the substrate;

the first surface is spaced apart from the second side of the substrate through a second surface in the first via hole, which second surface defines an isolation area between the first doped region and the second doped region, the passivation layer extends onto the first and the second side of the substrate and onto the surface in the first via hole and comprises a thermal oxide;

the via is part of a conductor extending to the emitter region at the first side to contacts at the second side, which conductor contacts the emitter region locally.

16. The solar cell as claimed in claim 11, wherein the back surface field is a selective back surface field.

17. The solar cell as claimed in claim 16, wherein the passivation layer comprises a thermal oxide and an LPCVD silicon nitride.

18. The solar cell as claimed in claim 16, wherein a junction between the emitter region and the semiconductor substrate is present at a deep junction depth.

\* \* \* \* \*